United States Patent
Khelif et al.

(10) Patent No.: US 7,880,563 B2
(45) Date of Patent: Feb. 1, 2011

(54) HIGH-FREQUENCY ACOUSTIC WAVE DEVICE

(75) Inventors: Abdelkrim Khelif, Besancon (FR); Abdelkrim Choujaa, Les Sapins (FR); Vincent Laude, Devecey (FR)

(73) Assignees: Centre National de la Recherche Scientifique, Paris (FR); Universite de Franche Comte, Besancon (FR)

( * ) Notice: Subject to any disclaimer, the term of this patent is extended or adjusted under 35 U.S.C. 154(b) by 181 days.

(21) Appl. No.: 11/884,499

(22) PCT Filed: Feb. 16, 2006

(86) PCT No.: PCT/FR2006/050142

§ 371 (c)(1),
(2), (4) Date: May 1, 2008

(87) PCT Pub. No.: WO2006/087496

PCT Pub. Date: Aug. 24, 2006

(65) Prior Publication Data

US 2008/0211602 A1 Sep. 4, 2008

(30) Foreign Application Priority Data

Feb. 16, 2005 (FR) .................... 05 50442

(51) Int. Cl.
*H03H 9/25* (2006.01)
*H03H 9/42* (2006.01)
(52) U.S. Cl. ..................... 333/151; 333/194
(58) Field of Classification Search ............ 333/133, 333/187, 188, 189, 190, 191, 192, 193, 194, 333/195, 196
See application file for complete search history.

(56) References Cited

U.S. PATENT DOCUMENTS

| | | | | |
|---|---|---|---|---|
| 4,037,176 A | * | 7/1977 | Ono et al. | 333/155 |
| 4,234,859 A | * | 11/1980 | Ikushima et al. | 333/151 |
| 4,427,913 A | | 1/1984 | Iafrate et al. | |
| 4,494,091 A | * | 1/1985 | Goll | 333/151 |
| 5,126,706 A | * | 6/1992 | Fleischmann et al. | 333/151 |
| 5,873,154 A | | 2/1999 | Ylilammi et al. | |
| 6,720,844 B1 | * | 4/2004 | Lakin | 333/189 |
| 6,963,257 B2 | * | 11/2005 | Ella et al. | 333/133 |
| 2007/0267942 A1 | * | 11/2007 | Matsumoto et al. | 310/313 A |
| 2009/0002098 A1 | * | 1/2009 | Mayer et al. | 333/189 |
| 2009/0079521 A1 | * | 3/2009 | Heinze et al. | 333/202 |

OTHER PUBLICATIONS

Irby et al., "Calculation of Delta and Kappa For an Acoustically Induced Distribution Bragg Reflector (ADBR)", IEEEE Journal of Quantum Electronics, vol. 34, No. 2, pp. 213-224 Feb. 1998.
Browning et al., "New Family of Bulk-Acoustic Wave Devices Employing Interdigital Transducers", Electronics Letters, IEE Stevenage, GB, vol. 25, pp. S-21-23 Nov. 1989.
International Search Report dated Jun. 21, 2006.
Bria, D., and Djafari-Rouham, B., "Omnidirectional Elastic Band Gap in Finite Lamellar Structures", Physics Review E 66, 056609, published Nov. 21, 2002, pp. 056609-1-056609-8, The American Physical Society.

* cited by examiner

*Primary Examiner*—Dean O Takaoka
(74) *Attorney, Agent, or Firm*—Howard IP Law Group, PC

(57) ABSTRACT

An acoustic wave device comprising a piezoelectric layer on an omnidirectional acoustic mirror and excitation and/or reception means on a surface of said piezoelectric layer, capable of exciting waves in a band gap of the acoustic mirror.

6 Claims, 2 Drawing Sheets

HIGH-FREQUENCY ACOUSTIC WAVE DEVICE

This application claims the benefit of Int'l. Application No. PCT/FR2006/050142, filed Feb. 16, 2006 and French Application No. 05/50442, filed Feb. 16, 2005, the entire disclosures of which are incorporated herein by reference.

FIELD OF THE INVENTION

The present invention relates to the field of acoustic wave propagation devices mainly used in electronics to form resonant systems, filters, delay lines, etc.

Such devices are especially used in the field of high frequencies, currently up to a few gigahertzes, and especially find applications in the field of transmissions, of television, of cell phones, of sensors, and of product labeling tags.

DISCUSSION OF PRIOR ART

Two types of acoustic wave devices can be distinguished: surface acoustic wave devices (SAW) and bulk acoustic wave devices (BAW).

FIG. 1 shows an example of a conventional surface acoustic wave device forming a delay line. This device is formed on a piezoelectric substrate 1, possibly one or several thin piezoelectric layers formed on a thicker substrate. The acoustic waves are transmitted in the substrate from two interdigital combs 2 and 3 comprising respective conductive fingers 4 and 5. If a time-variable or A.C. signal is applied between combs 2 and 3, this signal is turned by piezoelectric effect into a surface acoustic wave which propagates in substrate 1. The acoustic wave propagating in the substrate is collected by an assembly of two interdigital receiver combs 7 and 8 comprising respective metal fingers 9 and 10 with a delay corresponding to the distance traveled by the wave. The signal is for example collected across an electric impedance 11.

Such acoustic wave devices are well adapted to the forming of high-frequency components such as mentioned hereabove (delay lines, filters, resonators, etc.). They even enable forming relatively complex filters.

However, such devices raise practical implementation problems when their operating frequency increases. Indeed, tooth pitch P of combs 2-3 and 7-8 determines wavelength $\lambda$ of the acoustic wave by relation $P=\lambda/N$, with $N \geq 2$, generally equal to 2. In currently-used materials, propagation speed V of the surface waves is on the order of 5,000 m/s. For a 2.5-GHz frequency f, for example, the wavelength is 2 µm ($\lambda=V/f$), that is, the pitch of the comb teeth must be on the order of 1 µm. This results in metal fingers of a width on the order of 0.5 µm, spaced apart by a 0.5-µm distance. It is in practice difficult to further miniaturize conductive combs, on the one hand for lithography reasons, and on the other hand for electric loss reasons. Surface acoustic wave devices are thus in practice limited to operating frequencies on the order of from 1 to 3 GHz.

Another type of acoustic wave device exploits the properties of bulk acoustic waves. Generally, when the propagation medium is a thin layer, the bulk waves are exploited across the thickness of the thin layer. For this purpose, the electrodes are placed on either side of this thin layer. Such devices may operate at frequencies greater than 3 GHz but are often difficult to design, especially in the case where membranes are used.

U.S. Pat. No. 5,873,154 of Nokia Mobile Phones Limited, which described a specific bulk acoustic wave device structure, should in particular be considered. FIG. 2 attached herein is the same as FIG. 3 of said patent. It shows, on a substrate 20, for example, made of glass, a multilayer 21 forming an acoustic mirror based on the Bragg principle and comprising alternated layers 22 to 26, upper layer 26 being a conductive layer. A piezoelectric layer 28 is formed above the acoustic mirror and is coated with an electrode 29 to be excitable in resonance between electrodes 26 and 29. In this structure, acoustic mirror 21 is intended to avoid for the vibrations generated in piezoelectric layer 28 to reflect back in substrate 20. The waves formed in piezoelectric layer 28 are conventional bulk waves, and FIG. 4 of said patent indicates that the propagation speeds are on the order of 6,000 m/s for longitudinal waves and of 2,720 m/s for shear waves. Thus, in this device, acoustic mirror 21 is not intended to modify the features of bulk waves appearing in piezoelectric layer 28, but only to provide an isolation for the vibrations between piezoelectric layer 28 and substrate 20.

SUMMARY OF THE INVENTION

An object of the present invention is to provide an acoustic wave device allowing for the many applications of existing surface acoustic wave devices without the disadvantages thereof.

A more specific object of the present invention is to provide an acoustic wave device likely to operate at very high frequency.

Another object of the present invention is to provide an acoustic wave device simply excitable by surface structures with interdigital conductive finger combs, for example of the type conventionally used in surface acoustic wave devices.

To achieve these objects, the present invention provides an acoustic wave device comprising a piezoelectric layer on an omnidirectional acoustic mirror and excitation and/or reception means on a surface of said piezoelectric layer, capable of exciting waves in a band gap of the acoustic mirror.

According to an embodiment of the present invention, the excitation/reception means are interdigital conductive combs.

According to an embodiment of the present invention, the omnidirectional acoustic mirror is formed of a stacking of alternated high and low acoustic impedance layers.

The present invention provides using the above-mentioned device, especially as a filter, as a resonator, or as a delay line.

The present invention also provides a method for determining an acoustic wave device comprising a piezoelectric layer on an acoustic mirror, comprising the steps of:

for a given pair of materials forming the acoustic mirror on a given substrate, calculating the dispersion curves and selecting value D of the sum of the thicknesses of a layer of each material in the pair of materials so that a stacking of the pair of materials forms an omnidirectional mirror having a band gap in a desired frequency band; and selecting the thickness of the piezoelectric layer so that the mirror remains omnidirectional and that the piezoelectric layer has an acoustic vibration mode in the frequency band gap of the mirror.

BRIEF DESCRIPTION OF THE DRAWINGS

The foregoing and other objects, features, and advantages of the present invention will be discussed in detail in the following non-limiting description of specific embodiments in connection with the accompanying drawings, among which.

DETAILED DESCRIPTION

Figure 1:
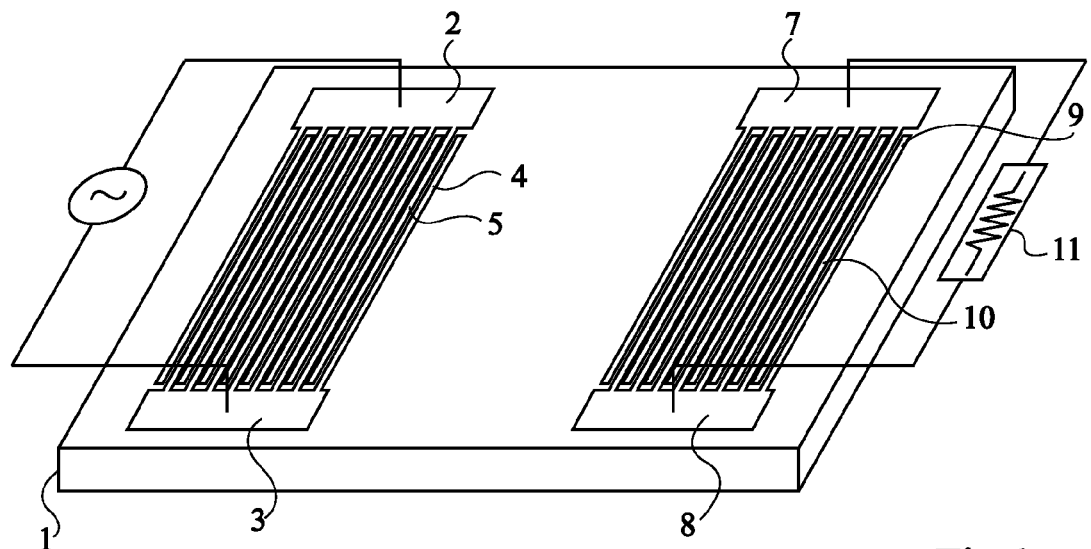
FIG. 1 is a simplified perspective view of a surface acoustic wave delay line.
Figure 2:
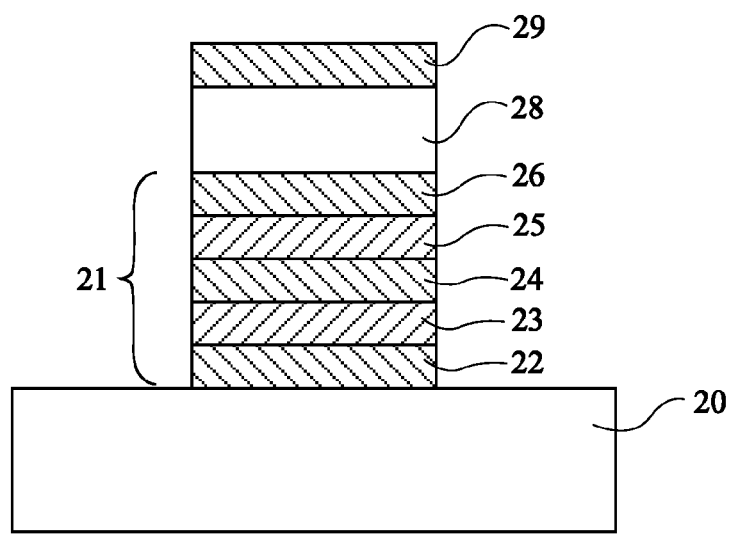
FIG. 2 is a cross-section view of a bulk acoustic wave device isolated from the substrate, such as described in U.S. Pat. No. 5,873,154.
Figure 3:
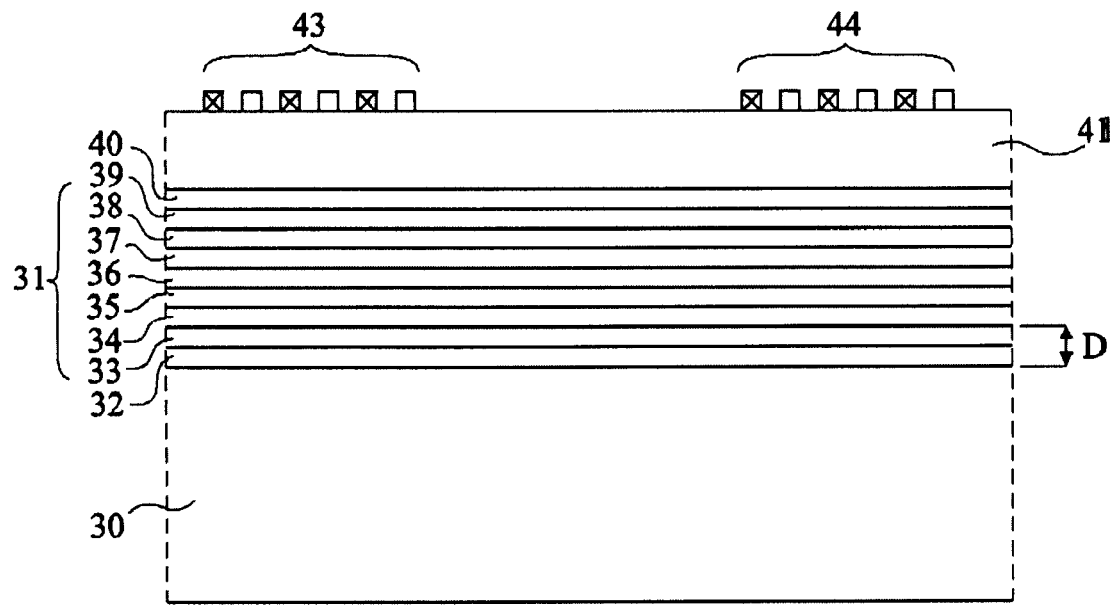
FIG. 3 shows a bulk acoustic wave device structure according to the present invention.

FIG. 3 shows an embodiment of an acoustic wave device according to the present invention. This device comprises a substrate 30 topped with an acoustic mirror 31 formed of an assembly of layers 32 to 40, the layers with an even reference numeral being of a first material and the layers with an odd reference numeral being of a second material, the two materials having clearly different acoustic impedances. A silicon substrate 30 and a mirror formed of an alternation of tungsten and aluminum layers may for example be used. Above the acoustic mirror is arranged a piezoelectric layer 41, for example, made of aluminum nitride, AlN, or of zinc oxide, ZnO. On piezoelectric layer 41 are arranged surface excitation means, for example, two excitation combs with interdigital teeth 43 and two reception combs with interdigital teeth 44 to form an acoustic wave delay line similar to that described in relation with FIG. 1.

The inventors have shown that, with such a structure, provided that certain dimension and frequency conditions which will be discussed hereafter are respected, the waves which propagate in piezoelectric layer 41 are no longer surface acoustic waves (SAW), nor bulk acoustic waves (BAW), but waves of a specific nature which will be called guided waves. The speed of such guided waves, which propagate in the layer plane, may be selected to be very high, for example, from five to ten times faster than the speed of surface acoustic waves. Further, such guided acoustic waves may be excited and received at the surface by the same interdigital conductive comb systems as conventional surface acoustic waves. The same components as those currently used in relation with surface acoustic waves can thus be formed in a structure according to the present invention.

The advantage of such a device is obvious. Since the acoustic waves propagate n times faster than conventional surface acoustic waves, waves can be propagated at a frequency which is n times as high in an excitation network of given pitch. Thus, in the case where n=6, an excitation or reception device currently used to operate at a given frequency may operate at a frequency which is 6 times higher. A surface exciter or receiver system adapted to a frequency on the order of 2 gigahertzes may be used for 12-gigahertz frequencies without modifying the tooth pitch of interdigital combs.

Any known mirror may be used as an acoustic mirror, provided that the assembly that it forms with the substrate exhibits an omnidirectional frequency band gap.

Figure 4:
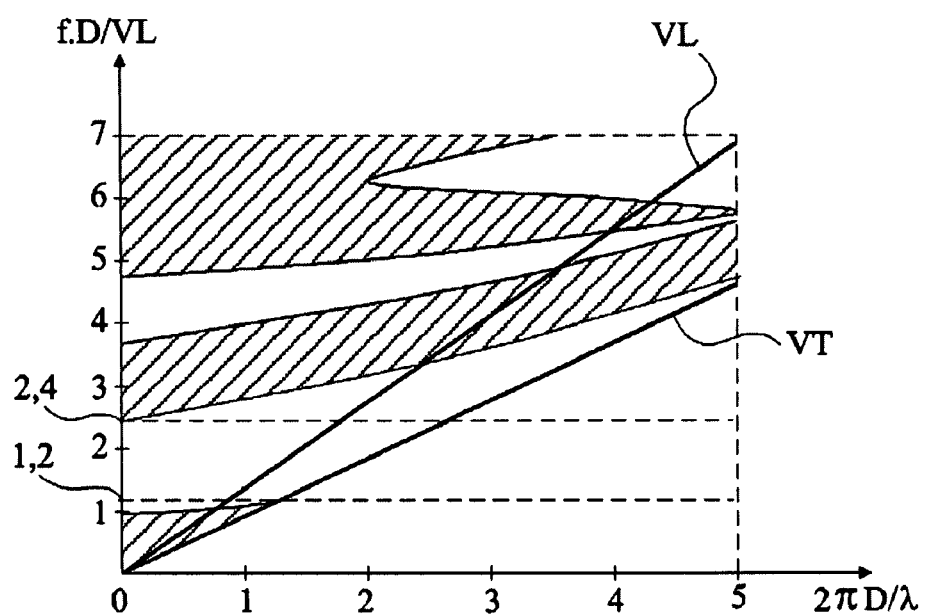
FIG. 4 shows the characteristic dispersion curves of a structure according to the present invention.

A mode for determining an omnidirectional mirror will be described in relation with FIG. 4. For a given multilayer, for example, an alternation of aluminum layers and of tungsten layers of same thicknesses, the dispersion curves illustrated in FIG. 4 are calculated (see for example Phys. Rev. E66, 056609, 2002, D. Bria and B. Djafari-Rouhani). The dispersion curves indicate, in hatchings, all the regions in which vibration modes may exist in the structure (mirror plus substrate) according to the ratio between pitch D of the multilayer and wavelength λ, the pitch being the sum of the thicknesses of a layer of each material forming the mirror. The two straight lines marked as VL and VT respectively indicate the transverse and longitudinal speeds of the acoustic waves in the substrate (silicon in this example). The blank areas illustrate the regions in which any propagation is forbidden. In the case of the illustrated structure, it can be seen that, in the range of (frequency)×(thickness) products between 1.2 and 2.4 GHz.μm (for example, for a pitch D=0.4 μm, the frequency band gap extends between 3 and 6 GHz), no propagation mode is possible whatever the wavelength. In this range, the structure reflects all waves of all incidences: it is an omnidirectional acoustic mirror. It should be noted that the limiting frequencies of the dispersion curves are proportional to pitch D of the multilayer structure. Thus, once the curve network has been determined for a given mirror layer pitch, a different band gap may be selected by proportionally increasing the layer pitch.

The thickness of piezoelectric layer 41 will then have to be selected so that it can vibrate in the concerned frequency band. Indeed, when a layer is added above a mirror, additional default modes are added. If some of these are in the band gap, they are necessarily guided in the layer with no opportunity of escaping into the substrate. For example, for an aluminum nitride (AlN) piezoelectric layer having a thickness on the order of 800 nm, a default mode in the band gap is obtained. The mode cut-off frequency is on the order of 4 GHz.

For a 3.57-μm comb pitch, the acoustic wave propagation speed parallel to the surface plane of the device is on the order of 30,000 m/s. This speed is seven times as high as the speed of usual surface waves in lithium tantalate substrates.

Propagation losses are substantially similar to those obtained for surface wave devices. Further, the obtained coupling coefficient is on the order of 3%, that is, substantially thirty time as large as that obtained in the case of a surface wave with a solid AlN material.

Although AlN has been indicated as a preferred material for the piezoelectric layer, any other currently-used piezoelectric material may be used, for example, ZnO, LiNbO$_3$, KNbO$_3$ . . .

Of course, the present invention is likely to have various alterations and modifications which will occur to those skilled in the art. In particular, one or several thin layers may be added above the device for passivation or encapsulation purposes. Further, a second acoustic mirror may be arranged above the piezoelectric layer to confine the acoustic power in this piezoelectric layer.

The invention claimed is:

1. A method for determining an acoustic wave device comprising a piezoelectric layer on an acoustic mirror, comprising the steps of:
    for a given pair of materials forming the acoustic mirror on a given substrate, calculating a dispersion curve linking the frequency of an acoustic wave in said acoustic mirror to the wavelength of said acoustic wave in said acoustic mirror and selecting the value of the sum of the thicknesses of a layer of each material in the pair of materials so that a stacking of the pair of materials forms an omnidirectional mirror having a band gap in a target frequency band; and
    selecting the thickness of the piezoelectric layer so that the mirror remains omnidirectional and that the piezoelectric layer has an acoustic vibration mode in the frequency band gap of the mirror.

2. The method of claim 1, wherein stacking the pair of materials includes stacking materials having alternating high and low acoustic impedance levels.

3. The method of claim 2, wherein the thickness of a pair of said alternated high and low acoustic impedance materials is selected according to a ratio between the thickness of said pair of said alternated high and low acoustic impedance materials and the wavelength of an acoustic wave in a structure comprising the omnidirectional acoustic mirror and a substrate.

4. The method of claim 1, further comprising the step of selecting an alternate band gap by proportionally increasing the omnidirectional mirror pitch, wherein the pitch is defined by the sum of the thicknesses of each material layer forming the omnidirectional mirror.

5. The method of claim 1, wherein the piezoelectric layer is formed from aluminum nitride (AlN).

6. The method of claim 1, wherein the piezoelectric layer is formed from at least one of lithium niobate ($LiNbO_3$), zinc oxide (ZnO), and potassium niobate ($KNbO_3$).

* * * * *